United States Patent [19]
Oku et al.

[11] Patent Number: 5,394,013
[45] Date of Patent: Feb. 28, 1995

[54] SEMICONDUCTOR DEVICE WITH AN ELEVATED BONDING PAD

[75] Inventors: Kazutoshi Oku; Masahiro Hirosue, both of Hyogo, Japan

[73] Assignee: Mitsubishi Denki Kabushiki Kaisha, Tokyo, Japan

[21] Appl. No.: 124,846

[22] Filed: Sep. 22, 1993

Related U.S. Application Data

[63] Continuation of Ser. No. 795,854, Nov. 21, 1991, abandoned.

[30] Foreign Application Priority Data

Nov. 28, 1990 [JP] Japan ................. 2-332170

[51] Int. Cl.⁶ .............. H01L 23/48; H01L 23/485; H01L 29/54
[52] U.S. Cl. ..................... 257/786; 257/758; 257/784
[58] Field of Search ............... 357/65, 68, 71; 257/758, 786, 784, 750

[56] References Cited

U.S. PATENT DOCUMENTS 4,617,193 10/1986 Wu ............................ 357/71

FOREIGN PATENT DOCUMENTS

| | | | |
|---|---|---|---|
| 0008785 | 1/1977 | Japan | 357/71 |
| 0026164 | 2/1977 | Japan | 357/71 |
| 0012735 | 1/1980 | Japan | 357/71 |
| 58-46851 | 10/1983 | Japan | 357/71 |
| 0005561 | 1/1986 | Japan | 357/71 |
| 61-108142 | 5/1986 | Japan | 357/71 |
| 0242333 | 10/1987 | Japan | 357/71 |
| 63-250142 | 10/1988 | Japan | 357/71 |
| 0165133 | 6/1989 | Japan | 257/784 |
| 0113533 | 4/1990 | Japan | 357/71 |

*Primary Examiner*—Robert P. Limanek
*Assistant Examiner*—Peter Toby Brown
*Attorney, Agent, or Firm*—Lowe, Price, LeBlanc & Becker

[57] ABSTRACT

A bonding pad comprises a central film and a peripheral film. The peripheral film is formed around the central film, including a film formed at the same time as the central film, and being continuous with the central film. The level of the central film is made equal to or higher than the level of a protective film on the peripheral film by central film raising means. Therefore, even if the wire moves in a lateral direction when the tip of a wire is pressed against the central film, the tip of the wire does not collide with the protective film. Accordingly, it is possible to avoid the case where cracks are generated in the surface protecting film during wire bonding because of a lateral movement of the wire.

2 Claims, 14 Drawing Sheets

5,394,013

SEMICONDUCTOR DEVICE WITH AN ELEVATED BONDING PAD

This application is a continuation of application Ser. No. 07/795,854, filed Nov. 21, 1991, now abandoned.

BACKGROUND OF THE INVENTION

Field of the Invention

The present invention relates to a semiconductor device and a method of manufacturing the same, and, particularly, it relates to a structure of a bonding pad and a method of forming a bonding pad.

Description of the Background Art

FIG. 9 is a sectional view of a conventional semiconductor device. A semiconductor device 1 comprises a silicon substrate 5, a die pad 3, and external leads 7.

Silicon substrate 5 is fixed on die pad 3. Bonding pads 11 are formed on the ends of a main surface 2 of silicon substrate 5. A plasma silicon nitride film 13 is formed on main surface 2 of silicon substrate 5 so as to expose bonding pads 11. Plasma silicon nitride film 13 serves as a surface protecting film protecting an integrated circuit formed on silicon substrate 5 from application environment.

External leads 7 are arranged at both sides of die pad 3. External leads 7 and bonding pads 11 are electrically connected through wires 9. Semiconductor device 1 is sealed with a resin 15.

FIG. 10 is a sectional view of a bonding pad forming part and a DRAM (Dynamic Random Access Memory) forming part of semiconductor device 1 shown in FIG. 9. First, bonding pad forming part 16 will be described.

A field oxide film 17, a BPSG (boro-phospho silicate glass) film 19, a plasma silicon oxide film 21, a bonding pad 11, and a plasma silicon nitride film 13 are sequentially formed on main surface 2 of silicon substrate 5, however, plasma silicon nitride film 13 is not formed on bonding pad 11. Bonding pad 11 is electrically connected to wire 9.

DRAM forming part 18 will be described. In the vicinity of main surface 2 of silicon substrate 5, impurity diffused regions 23a, 23b are formed, spaced apart from each other. A thin silicon oxide film 27 is formed over main surface 2. A polysilicon film 31 is formed on thin silicon film 27 on impurity diffused region 23a. A polysilicon film 25 is formed on polysilicon film 31 and on thin silicon oxide film 27 between impurity diffused regions 23a and 23b.

A BPSG film 19 is formed over main surface 2. A through-hole 30 is formed in BPSG film 19 on impurity diffused region 23b. A first aluminum film 29 is formed over BPSG film 19. First aluminum film 29 and impurity diffused region 23b are electrically connected through an aluminum film 32 formed in through-hole 30.

A plasma silicon oxide film 21 is formed over first aluminum film 29. Second aluminum films 33 are formed, spaced apart from each other, on plasma silicon oxide film 21. A plasma silicon nitride film 13 is formed over plasma silicon oxide film 21 and second aluminum films 33.

Polysilicon film 25 constitutes a word line. First aluminum film 29 constitutes a bit line. Impurity diffused region 23a, thin silicon oxide film 27, and polysilicon film 31 constitute a capacitor. Electricity supplied from a power supply (not shown) is supplied through wire 9 and bonding pad 11 to DRAM forming part 18.

Next, a description will be given on a manner in which a bonding pad and an electronic device are electrically connected. FIG. 11 is a view illustrating electrical connection state between a bonding pad and a MOS (Metal Oxide Semiconductor) field effect transistor. A field oxide film 17, a source region 35, and a drain region 37 are formed in the vicinity of main surface 2 of silicon substrate 5. A gate oxide film 39 is formed on main surface 2 between source region 35 and drain region 37. A gate electrode 41 is formed over gate oxide film 39.

BPSG film 19 and plasma silicon oxide film 21 are sequentially formed on main surface 2. A through-hole 40 is formed in BPSG film 19 on gate electrode 41. A first aluminum film 43 is formed on BPSG film 19. First aluminum film 43 and gate electrode 41 are electrically connected through aluminum formed in through-hole 40.

Bonding pad 11 and a second aluminum film 45 are formed on plasma silicon oxide film 21. The aluminum film formed on plasma silicon oxide film 21 is patterned to provide bonding pad 11 and second aluminum film 45. A through-hole 44 is formed in plasma silicon oxide film 21 on first aluminum film 43. Second aluminum film 45 and first aluminum film 43 are electrically connected through aluminum formed in through-hole 44.

Plasma silicon nitride film 13 is formed over main surface 2. However, plasma silicon nitride film 13 is not formed on bonding pad 11. Bonding pad 11 and wire 9 are electrically connected.

A method of forming a conventional bonding pad will be described with reference to FIGS. 12A–12D.

As shown in FIG. 12A, a field oxide film 17, a BPSG film 19, a plasma silicon oxide film 21, an aluminum film 47, and a resist 49 are formed sequentially on a main surface 2 of a silicon substrate 5. Prescribed patterning is carried out on resist 49.

As shown in FIG. 12B, aluminum film 47 is selectively etched, using resist 49 as a mask, to form a bonding pad 11. The resist on bonding pad 11 is removed.

As shown in FIG. 12C, a plasma silicon nitride film 13 and a resist 51 are formed sequentially on main surface 2. Prescribed patterning is carried out on resist 51.

As shown in FIG. 12D, plasma silicon nitride film 13 on bonding pad 11 is selectively removed, using resist 51 as a mask, to expose bonding pad 11. As described above, the formation process of a conventional bonding pad is completed.

Now, a process of electrically connecting external lead 7 and bonding pad 11, shown in FIG. 9, with wire 9 will be described with reference to FIGS. 13A–13D.

As shown in FIG. 13A, silicon substrate 5 and external lead 7 are arranged, spaced apart from each other. Silicon substrate 5 is fixed on die pad 3. Bonding pads 11 are formed at the ends of main surface 2 of silicon substrate 5. In FIG. 13A, illustration of plasma silicon nitride film 13 shown in FIG. 9 is omitted. Capillary 53 is provided with a through-hole. Wire 9 extends through the through-hole. The tip 57 of wire 9 is formed spherical. Tip 57 of wire 9 is pressed against bonding pad 11 while die pad 3 is heated.

As shown in FIG. 13B, wire 9 is excited with ultrasonic waves to connect bonding pad 11 and tip 57.

As shown in FIG. 13C, capillary 53 is moved as shown by an arrow to press wire 9 onto external lead 7.

Then, wire 9 is excited with ultrasonic waves to connect external lead 7 and wire 9.

As shown in FIG. 13D, wire 9 is pulled and cut by pulling up capillary 53. Tip 57 of wire 9 is made spherical with a discharge torch 59. As described above, wire bonding is completed.

Problems of a conventional bonding pad will be described in the following. FIG. 14 is a sectional view of a conventional bonding pad forming part. The parts which are the same as the parts indicated by the reference numerals in FIG. 10 are given the same numerals and description of them is not repeated.

There is a case where during wire bonding, pressing tip 57 of wire 9 against bonding pad 11 influences wire 9 to move in a lateral direction. If the lateral movement of wire 9 is large, tip 57 collides with a side wall 67 of plasma silicon nitride film 13. There is a case where this collision generates a crack 63 in plasma silicon nitride film 13.

FIG. 15 is a plan view of a plasma silicon nitride film in which a crack is generated. 65 is an aluminum wiring electrically connected to bonding pad 11. Aluminum wiring 65 is electrically connected to the electronic device formed on the silicon substrate. Moisture in the external atmosphere enters through crack 63 into the semiconductor device. If moisture enters into the semiconductor device, the semiconductor device becomes out of order.

A method conceivable of reducing possibility of collision of the tip and the side wall even if the tip moves in a lateral direction is to increase the area of the bonding pad. At present, however, the number of bonding pads has already been increased, and in some cases, bonding pads are formed on the whole periphery of the main surface of the silicon substrate. In such a case, if the area of the bonding pad is increased, the area of the silicon substrate itself has to be increased. Increasing the area of the silicon substrate is against the demand for miniaturization of a semiconductor device.

A bonding pad of interest is disclosed in Japanese Patent Laying-Open No. 63-250142 (1988), in which no crack is generated in the surface protecting film even if wire 9 moves in a lateral direction, and no increase of the area of the bonding pad is necessary. FIG. 16 is a sectional view of the bonding pad disclosed in the laid open application. As shown in FIG. 16, a first aluminum film 83 and an interlayer insulator 85 are formed on the same plane. First aluminum film 83 comprises a central film 82 and a peripheral film 84. Interlayer insulator 85 runs on peripheral film 84.

A second aluminum film 87 is formed on central film 82. A surface protecting film 89 is formed on interlayer insulator 85. A bonding pad 91 comprises a two-layer structure of first aluminum film 83 and second aluminum film 87.

The level of second aluminum film 87 and the level of surface protecting film 89 are approximately at the same height. Accordingly, even if the wire moves in a lateral direction, the tip of the wire does not collide with surface protecting film 89. Since the tip of wire and the surface protecting film do not collide, it is possible to reduce the area of second aluminum film 87.

However, since no member presses down second aluminum film 87, there is a possibility that second aluminum film 87 peels off first aluminum film 83.

On the other hand, as shown in FIG. 17, when wire 9 is pressed against bonding pad 91, if positioning of wire 9 on bonding pad 91 is improper, tip 57 directly collides with surface protecting film 89. If tip 57 directly collides with surface protecting film 89, there is a possibility that crack 63 is generated in surface protective film 89.

SUMMARY OF THE INVENTION

An object of the present invention is to provide a semiconductor device comprising a bonding pad in which the area of the bonding pad does not have to be increased, the bonding pad can be prevented from peeling off, and no crack is generated in a surface protecting film during wire bonding even if the tip of a wire moves in a lateral direction.

Another object of the present invention is to provide a method of manufacturing a semiconductor device comprising a bonding pad in which the area of the bonding pad does not have to be increased, the bonding pad can be prevented from peeling off, and no crack is generated in a surface protecting film during wire bonding even if the tip of a wire moves in a lateral direction.

Still another object of the present invention is to provide a semiconductor device comprising a bonding pad in which the area of the bonding pad does not have to be increased, the bonding pad can be prevented from peeling off, no crack is generated in a surface protecting film during wire bonding even if the tip of a wire moves in a lateral direction, and the tip of the wire does not directly collide with the surface protecting film even if positioning of the wire on the bonding pad is improper.

A further object of the present invention is to provide a method of manufacturing a semiconductor device comprising a bonding pad in which the area of the bonding pad does not have to be increased, the bonding pad can be prevented from peeling off, no crack is generated in the surface protecting film during wire bonding even if the tip of a wire moves in a lateral direction, and the tip of the wire does not directly collide with the surface protecting film even if positioning of the wire on the bonding pad is improper.

A semiconductor device according to the present invention comprises a substrate, a device, a bonding pad, central film raising means, and a protective film. The device is formed on the substrate. The bonding pad is formed on the substrate and electrically connected with the device. The bonding pad comprises a central film and a peripheral film around the central film comprising a film being formed at the same time as the central film and continuous with the central film. The central film raising means raises the central film by being placed below the central film to make the level of the central film higher than the level of the peripheral film. The protective film is formed on the substrate so as to expose the central film and cover the device. The protective film protects the device from application environment of the semiconductor device. The level of the central film is equal to or higher than the level of the protective film on the peripheral film.

A method of manufacturing a semiconductor device according to the present invention comprises the following steps. A first film is formed on a substrate. Prescribed patterning is carried out on the first film. A second film electrically connected with a device is formed on the substrate including the first film. A step is generated, by the first film, in the second film in the vicinity of the periphery of the first film. The second film comprises a central film on the first film and a peripheral film being continuous with the central film and placed around the first film. A bonding pad comprising a central film and a peripheral film is formed by removing the peripheral film other than the peripheral film in the vicinity of the step. A protective film protecting the device from application environment of the semiconductor device is formed on the substrate including the bonding pad and the device. The protective layer on the central film is removed to expose the central film.

The bonding pad comprised in the semiconductor device according to the present invention includes the central film and the peripheral film. The level of the central film is made equal to or higher than the level of the protective film on the peripheral film by the central film raising means. Therefore, during wire bonding, when the tip of the wire is pressed against the central film, the tip of the wire does not collide with the protective film even if the wire moves in a lateral direction. Accordingly, it is possible to prevent the generation of cracks in the protective film caused by a lateral movement of the wire during wire bonding.

During wire bonding, the tip of the wire does not collide with the protective film even if the wire moves in a lateral direction, so that it is possible to reduce the area of the central film. Since it is possible to reduce the area of the central film, it is also possible to reduce the area of the bonding pad.

The peripheral film comprising a film formed at the same time as the central film. The peripheral film is continuous with the central film. The protective film is formed on the peripheral film. Therefore, it is possible to prevent the bonding pad from peeling off.

According to a method of manufacturing a semiconductor device in accordance with the present invention, the bonding pad is as described in the following. The central film and the peripheral film of the bonding pad are formed at the same time and continuous with each other. The level of the central film of the bonding pad becomes equal to or higher than the level of the protective film on the peripheral film of the bonding pad. The peripheral film of the bonding pad is pressed by the protective film. Therefore, the bonding pad comprised in the semiconductor device according to the present invention can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (a first embodiment)

Figure 1:
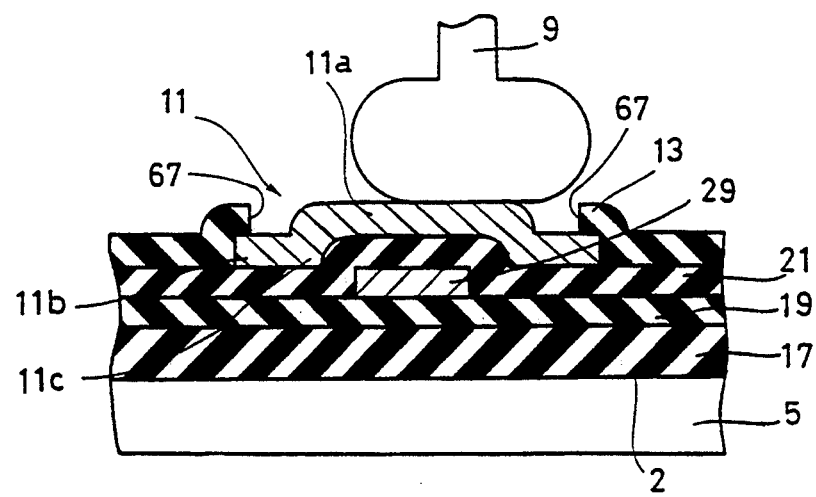
FIG. 1 is a sectional view of a bonding pad comprised in a first embodiment of a semiconductor device according to the present invention.
Figure 3:
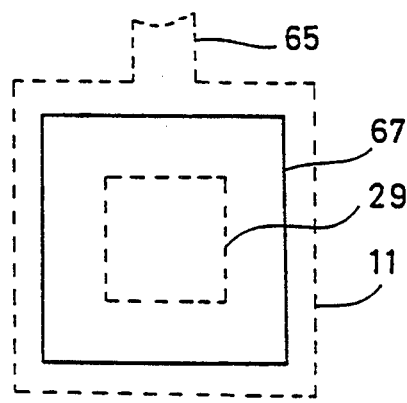
FIG. 3 is a plan view of the bonding pad comprised in the first embodiment of a semiconductor device according to the present invention.

A first embodiment of the present invention will be described in the following. FIG. 1 is a sectional view of a bonding pad comprised in a first embodiment of a semiconductor device according to the present invention. FIG. 3 is a plan view of the bonding pad comprised in the first embodiment of a semiconductor device according to the present invention. Referring to FIGS. 1 and 3, a structure of the bonding pad comprised in the first embodiment of a semiconductor device according to the present invention will be described.

A field oxide film 17 and a BPSG film 19 are formed sequentially on a main surface 2 of a silicon substrate 5. A first aluminum film 29 is selectively formed on BPSG film 19. A plasma silicon oxide film 21 is formed on first aluminum film 29 and on BPSG film 19. A bonding pad 11 is formed on plasma silicon oxide film 21. Bonding pad 11 comprising a central film 11a and a peripheral film 11b. The level of central film 11a is made higher than the height of the peripheral film 11b by first aluminum film 29.

A plasma silicon nitride film 13 is formed on plasma silicon oxide film 21. Plasma silicon nitride film 13 serves as a surface protecting film protecting the device formed on silicon substrate 5 from application environment of the semiconductor device. A part of plasma silicon nitride film 13 runs on peripheral film 11b. The level of central film 11a is as high as the level of plasma silicon nitride film 13 on peripheral film 11b.

A wire 9 is on central film 11a. Central film 11a and wire 9 are electrically connected. 67 is a side wall of plasma silicon nitride film 13.

An aluminum wiring 65 is electrically connected to bonding pad 11. Aluminum wiring 65 is electrically connected to the device (not shown in FIGS. 1 and 3) formed on silicon substrate 5.

A method of forming the bonding pad illustrated in FIG. 1 will be described in the following. FIGS. 2A-2G are sectional views of a semiconductor device illustrating sequentially a formation process of the bonding pad illustrated in FIG. 1.

Figure 2A:
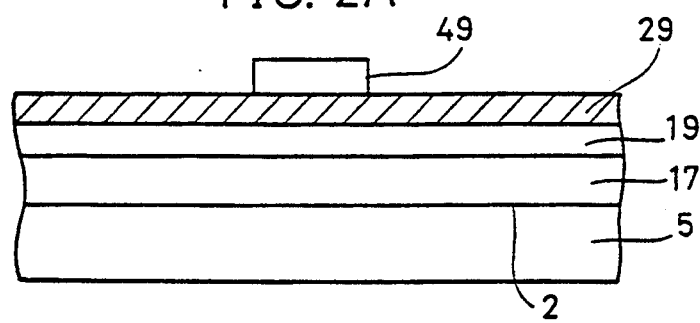
FIGS. 2A-2G are sectional views of a semiconductor device illustrating sequentially a formation process of the bonding pad comprised in the first embodiment of the semiconductor device according to the present invention.

As shown in FIG. 2A, a field oxide film 17 is formed on a main surface 2 of a silicon substrate 5 using a LOCOS (Local Oxidation of Silicon) method. A BPSG film 19 is formed on field oxide film 17 using a CVD (Chemical Vapor Deposition) method. A first aluminum film 29 is formed on BPSG film 19 using a sputtering method. A resist 49 is formed on first aluminum film 29. Prescribed patterning is carried out on resist 49.

Figure 2B:
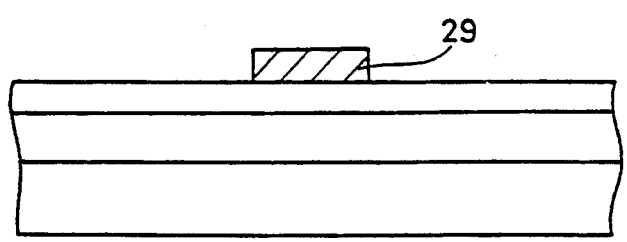

As shown in FIG. 2B, first aluminum film 29 is selectively etched away using resist 49 as a mask. Then, resist 49 is removed.

Figure 2C:
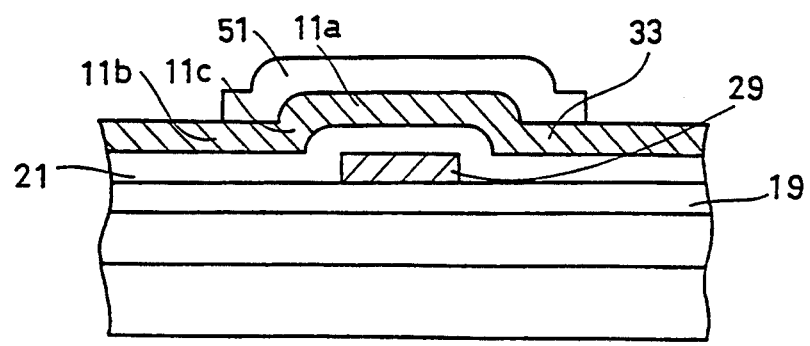

As shown in FIG. 2C, a plasma silicon oxide film 21 is formed on BPSG film 19 and on first aluminum film 29 using a plasma CVD method. The plasma CVD method is used for forming the silicon oxide film in order to prevent first aluminum film 29 from melting. Specifically, a normal CVD method causes aluminum to melt because the film forming temperature is higher than the melting point of aluminum.

A second aluminum film 33 is formed on plasma silicon oxide film 21 using a sputtering method. A step 11c is generated in second aluminum film 33 by first aluminum film 29. Second aluminum film 33 on first aluminum film 29 is referred to as a central film 11a. Second aluminum film 33 around first aluminum film 29 is referred to as a peripheral film 11b. A resist 51 is formed on second aluminum film 33. Prescribed patterning is carried out on resist 51.

Figure 2D:
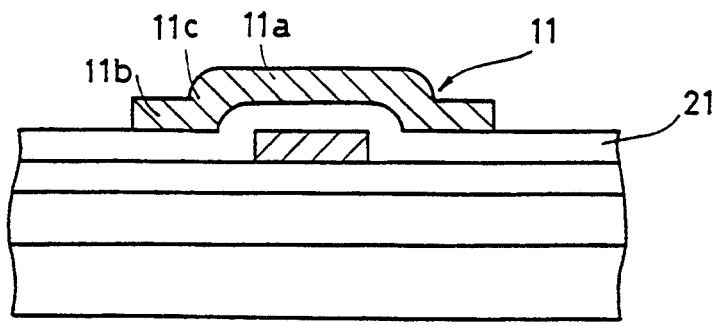

As shown in FIG. 2D, a bonding pad 11 is formed by etching away peripheral film 11b other than peripheral film 11b in the vicinity of step 11c using resist 51 as a mask. Resist 51 is then removed.

Figure 2E:
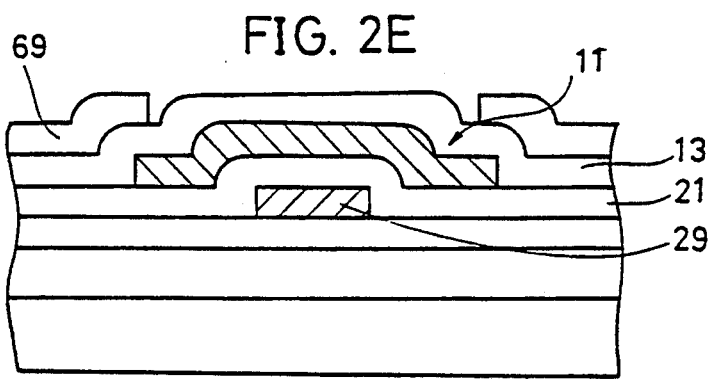

As shown in FIG. 2E, a plasma silicon nitride film 13 is formed on plasma silicon oxide film 21 and on bonding pad 11 using a plasma CVD method. The reason for forming the silicon nitride film by a plasma CVD method is the same as the reason for forming the silicon oxide film on first aluminum film 29 using a plasma CVD method. A resist 69 is formed on plasma silicon nitride film 13. Prescribed patterning is carried out on resist 69.

Figure 2F:
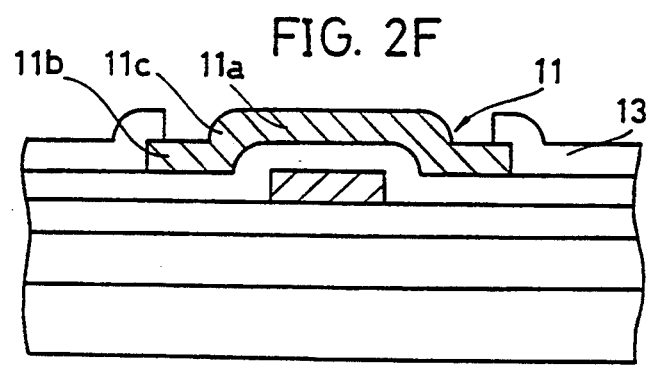

As shown in FIG. 2F, plasma silicon nitride film 13 is selectively etched away using resist 69 as a mask to expose a part of peripheral film 11b and central film 11a. As described above, a formation process of the bonding pad comprised in the first embodiment of a semiconductor device according to the present invention is completed.

Figure 2G:
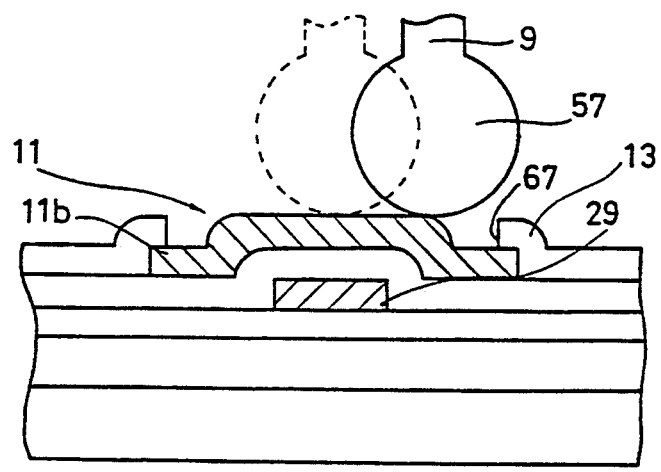

As shown in FIG. 2G, even if wire 9 moves from the position shown by the dotted line to the position shown by the solid line when the tip 57 of a wire 9 is pressed against bonding pad 11, tip 57 does not collide with a side wall 67. Besides, plasma silicon nitride film 13 runs on peripheral film 11b so that bonding pad 11 does not peel off.

(a second embodiment)

Figure 4:
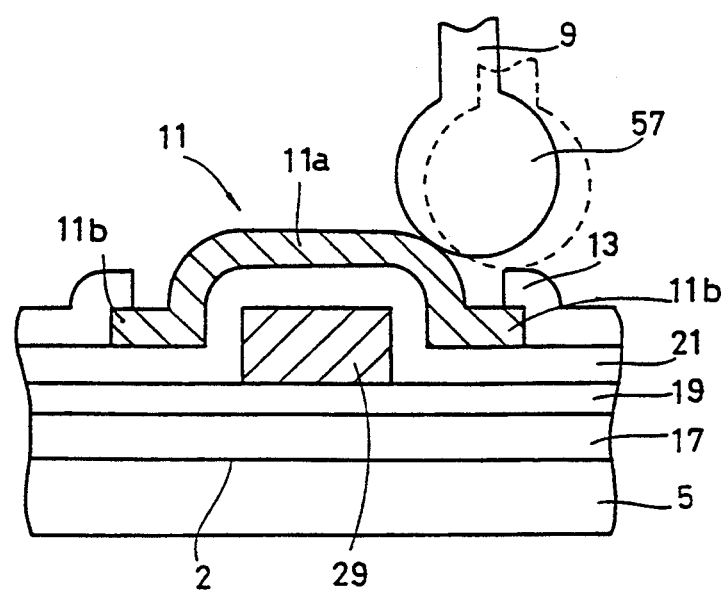
FIG. 4 is a sectional view of a bonding pad comprised in a second embodiment of a semiconductor device according to the present invention.

A bonding pad comprised in a second embodiment of a semiconductor device according to the present invention will be described in the following. FIG. 4 is a sectional view of a bonding pad comprised in a second embodiment of a semiconductor device according to the present invention.

A field oxide film 17 is formed on a main surface 2 of a silicon substrate 5. A BPSG film 19 is formed on field oxide film 17. A first aluminum film 29 is selectively formed on BPSG film 19. A plasma silicon oxide film 21 is formed on first aluminum film 29 and on BPSG film 19. A bonding pad 11 is formed on plasma silicon oxide film 21. Bonding pad 11 comprises a central film 11a and a peripheral film 11b. A plasma silicon nitride film 13 is formed on plasma silicon oxide film 21. A part of plasma silicon nitride film 13 runs on bonding pad 11.

In the second embodiment of the present invention, the level of central film 11a is made higher than the level of the plasma silicon nitride film 13 on peripheral film 11b by making the thickness of first aluminum film 29 larger.

Figure 16:
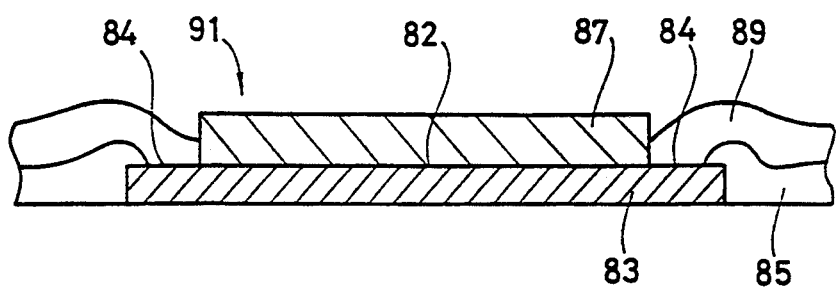
FIG. 16 is a sectional view of a bonding pad disclosed in Japanese Patent Laying-Open No. 63-250142 (1988).
Figure 17:
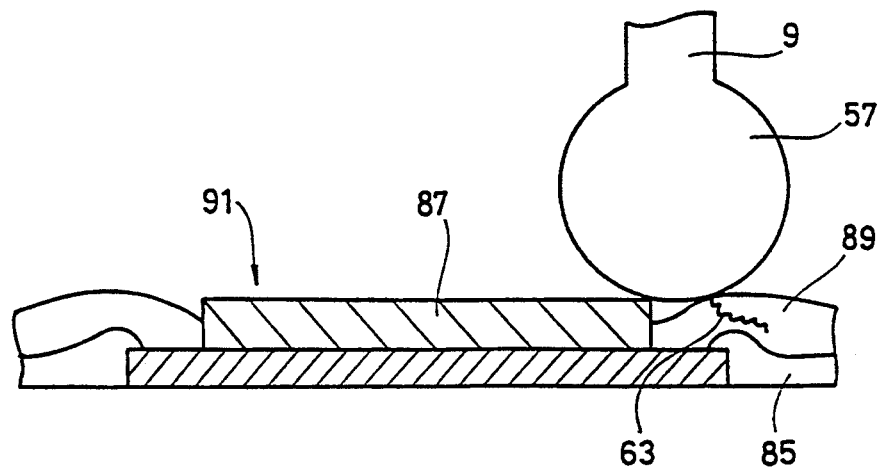
FIG. 17 is a sectional view of a semiconductor device for describing a problem of the bonding pad disclosed in Japanese Patent Laying-Open No. 63-250142 (1988).

As shown in FIG. 17, in the bonding pad disclosed in Japanese Patent Laying-Open No. 63-250142 (1988) illustrated in FIG. 16, if positioning of wire 9 on bonding pad 91 is improper, tip 57 directly collides with surface protecting film 89. There is a possibility that crack 63 is generated by this.

In the second embodiment of the present invention illustrated in FIG. 4, even if positioning of wire 9 on bonding pad 11 is improper, tip 57 first collides with bonding pad 11 and then collides with plasma silicon nitride film 13. Accordingly, the impact applied on plasma silicon nitride film 13 is smaller than that in the case where tip 57 directly collides with plasma silicon nitride film 13. Since the impact applied on plasma silicon nitride film 13 is small, cracks are rarely generated in plasma silicon nitride film 13.

Furthermore, it goes without saying that the second embodiment of the present invention has the same effect as that of the first embodiment of the present invention previously described.

(a third embodiment)

Figure 5:
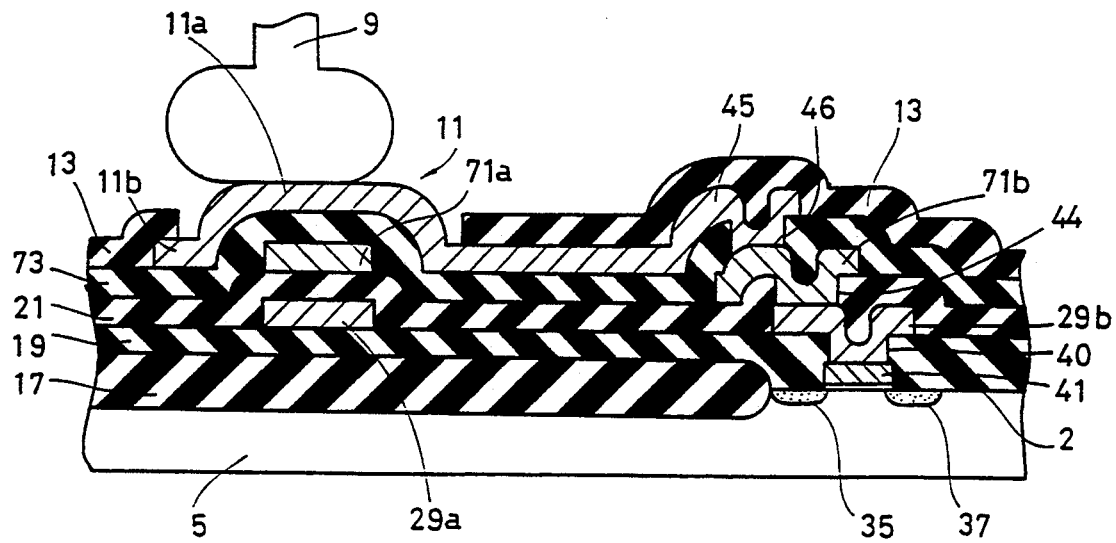
FIG. 5 is a sectional view of a bonding pad comprised in a third embodiment of a semiconductor device according to the present invention.

A bonding pad comprised in a third embodiment of a semiconductor device according to the present invention will be described in the following. FIG. 5 is a sectional view of a bonding pad comprised in a third embodiment of a semiconductor device according to the present invention. A field oxide film 17, a source region 35, and a drain region 37 are formed in the vicinity of a main surface 2 of silicon substrate 5. A gate electrode 41 is formed on main surface 2 between source region 35 and drain region 37.

A BPSG film 19 is formed over the whole of main surface 2 of silicon substrate 5. A through-hole 40 is provided in BPSG film 19 on gate electrode 41. First aluminum films 29a, 29b are formed on BPSG film 19. First aluminum film 29b and gate electrode 41 are electrically connected through aluminum formed in through-hole 40.

A plasma silicon oxide film 21 is formed over the whole of main surface 2 of silicon substrate 5. Second aluminum films 71a, 71b are formed on plasma silicon oxide film 21. A through-hole 44 is formed on plasma silicon oxide film 21 on first aluminum film 29b. Second aluminum film 71b and first aluminum film 29b are electrically connected through aluminum formed in through-hole 44. A plasma silicon oxide film 73 is formed over the whole of main surface 2 of silicon substrate 5. A bonding pad 11 and a third aluminum film 45 are formed on plasma silicon oxide film 73. Bonding pad 11 and third aluminum film 45 are electrically connected. Bonding pad 11 comprises a central film 11a and a peripheral film 11b. A through-hole 46 is formed in plasma silicon oxide film 73 on second aluminum film 71b. Third aluminum film 45 and second aluminum film 71b are electrically connected through aluminum formed in through-hole 46.

A plasma silicon nitride film 13 is formed over the whole of main surface 2 of silicon substrate 5. Plasma silicon nitride film 13 on central film 11a is selectively removed. A wire 9 is on bonding pad 11. Wire 9 and bonding pad 11 are electrically connected.

The level of central film 11a is made higher than the level of plasma silicon nitride film 13 on peripheral film 11b by first aluminum film 29a and second aluminum film 71a.

In the third embodiment of the present invention, when first aluminum film 29b is formed, first aluminum film 29a is formed at the same time. Further, when second aluminum film 71b is formed, second aluminum film 71a is formed at the same time. Therefore, a new step of forming first aluminum film 29a and second aluminum film 71a as central film raising means is not necessary.

(a fourth embodiment)

A bonding pad comprised in a fourth embodiment of a semiconductor device according to the present invention will be described in the following. FIG. 6G is a sectional view of a bonding pad comprised in a fourth embodiment of semiconductor device according to the present invention.

A field oxide film 75 and a silicon oxide film 80 are formed on a main surface 2 of a silicon substrate 5. A BPSG film 19 is formed on field oxide film 75 and on silicon oxide film 80. A bonding pad 11 and a plasma silicon nitride film 13 are formed on BPSG film 19. Bonding pad 11 comprises a central film 11a and a peripheral film 11b. A part of plasma silicon nitride film 13 runs on peripheral film 11b. A wire 9 is on central film 11a. Wire 9 and central film 11a are electrically connected. A formation method of the bonding pad illustrated in FIG. 6G will be described with reference to FIGS. 6A–6G.

Figure 6A:
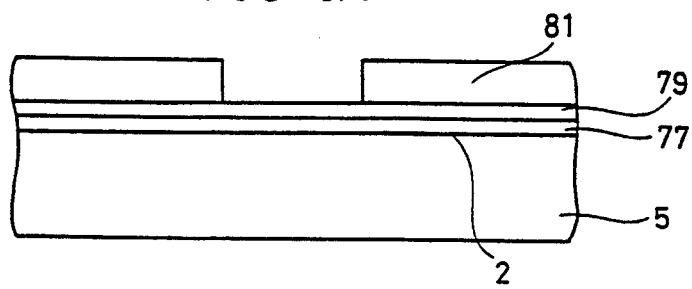
FIGS. 6A-6G are sectional views of a semiconductor device illustrating sequentially a formation process of a bonding pad comprised in a fourth embodiment of a semiconductor device according to the present invention.

As illustrated in FIG. 6A, a silicon oxide film 77 is formed on the whole of a main surface 2 of a silicon substrate 5 by thermal oxidation. A silicon nitride film 79 is formed over silicon oxide film 77 using a CVD method. A resist 81 is formed over silicon nitride film 79. Prescribed patterning is carried out on resist 81.

Figure 6B:
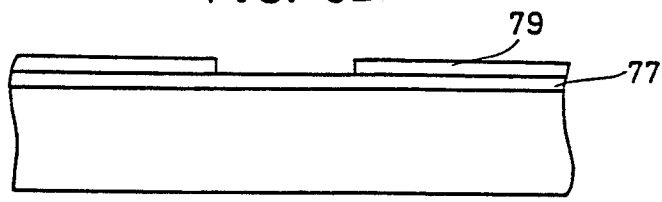

As illustrated in FIG. 6B, silicon nitride film 79 is selectively removed using resist 81 as a mask. Then, resist 81 is removed.

Figure 6C:
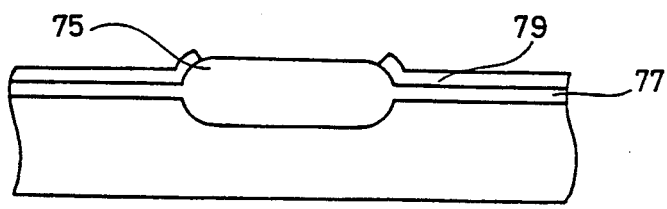

As illustrated in FIG. 6C, silicon oxide film 77 is selectively oxidized using silicon nitride film 79 as a mask to form a field oxide film 75. Silicon nitride film 79 is removed.

Figure 6D:
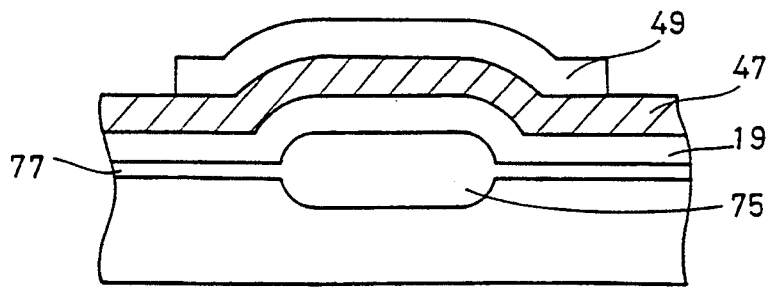

As illustrated in FIG. 6D, a BPSG film 19 is formed over field oxide film 75 and over silicon oxide film 77 using a CVD method. An aluminum film 47 is formed over BPSG film 19 by a sputtering method. A resist 49 is formed on aluminum film 47. Prescribed patterning is carried out on resist 49.

Figure 6E:
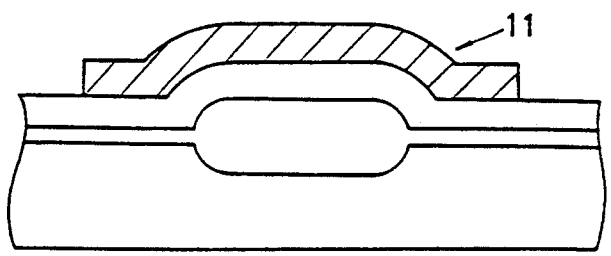

As illustrated in FIG. 6E, aluminum film 47 is selectively etched away using resist 49 as a mask to form a bonding pad 11.

Figure 6F:
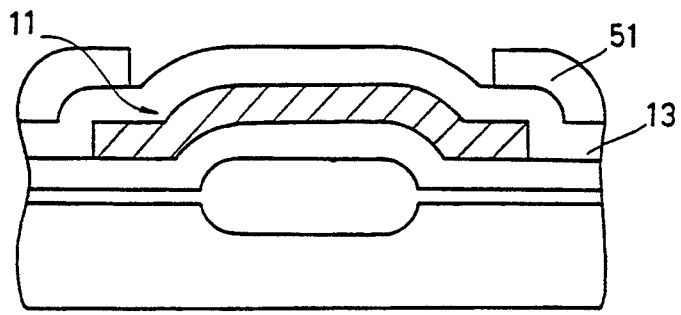
Figure 6G:
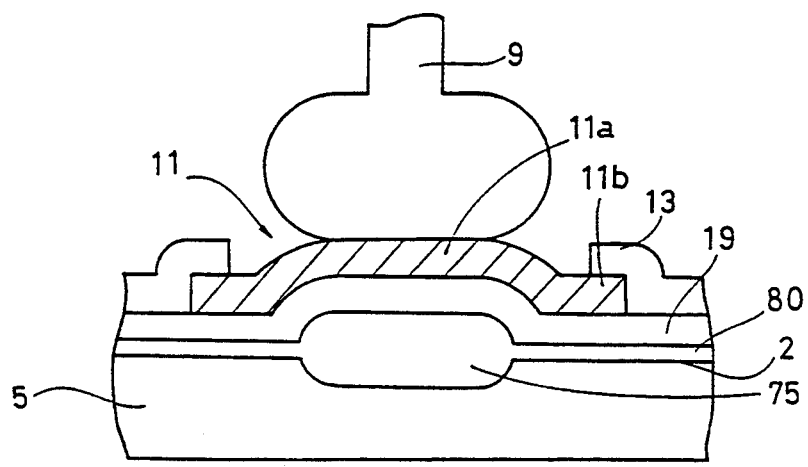

As illustrated in FIG. 6F, a plasma silicon nitride film 13 is formed over bonding pad 11 using a plasma CVD method. A resist 51 is formed on plasma silicon nitride film 13. Prescribed patterning is carried out on resist 51.

As illustrated in FIG. 6G, plasma silicon nitride film 13 is selectively etched away using resist 51 as a mask to expose bonding pad 11. Then, a wire 9 is electrically connected to bonding pad 11. As described above, a formation process of the bonding pad comprised in the fourth embodiment of a semiconductor device according to the present invention is completed. In the fourth embodiment of the present invention, field oxide film 75 serves as central film raising means.

(a fifth embodiment)

A bonding pad comprised in a fifth embodiment of a semiconductor device according to the present invention will be described in the following. FIG. 7H is a sectional view of a bonding pad comprised in a fifth embodiment of a semiconductor device according to the present invention.

A field oxide film 17 and a BPSG film 19 are formed sequentially on the whole of a main surface 2 of a silicon substrate 5.

First aluminum films 29a, 29b, plasma silicon oxide films 21a, 21b, and a plasma silicon nitride film 13a are formed on BPSG film 19. A through-hole 30 is formed in plasma silicon oxide film 21b on first aluminum film 29b.

A bonding pad 11 is formed on plasma silicon oxide film 21a. Bonding pad 11 comprises a central film 11a and a peripheral film 11b. A second aluminum film 33 is formed on plasma silicon oxide film 21b. Second aluminum film 33 and bonding pad 11 are electrically connected. Second aluminum film 33 and first aluminum film 29b are electrically connected through aluminum formed in through-hole 30.

A plasma silicon nitride film 13b is formed on second aluminum film 33. A wire 9 is electrically connected to bonding pad 11.

A method of forming a bonding pad comprised in the fifth embodiment of a semiconductor device according to the present invention will be described with reference to FIGS. 7A–7H. FIGS. 7A–7H are sectional views of a semiconductor device illustrating sequentially a formation process of a bonding pad comprised in a fifth embodiment of a semiconductor device according to the present invention.

Figure 7A:
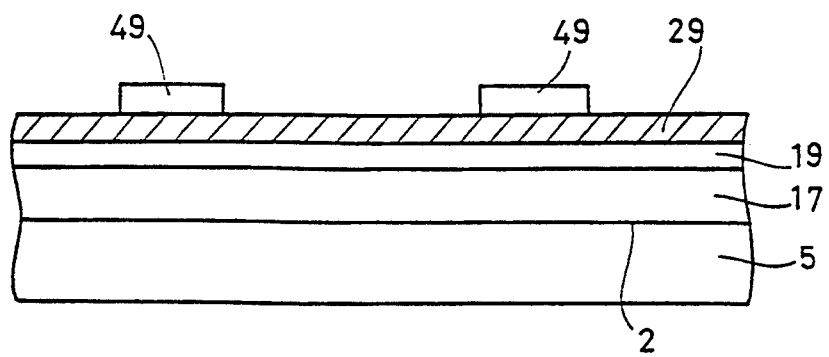
FIG. 7A-7H are sectional views of a semiconductor device illustrating sequentially a formation process of a bonding pad comprised in a fifth embodiment of a semiconductor device according to the present invention.

As illustrated in FIG. 7A, a field oxide film 17 is formed on the whole of a main surface 2 of a silicon substrate 5 using a LOCOS method. A BPSG film 19 is formed over field oxide film 17 using a CVD method. A first aluminum film 29 is formed over BPSG film 19 using a sputtering method. A resist 49 is formed on first aluminum film 29. Prescribed patterning is carried out on resist 49.

Figure 7B:
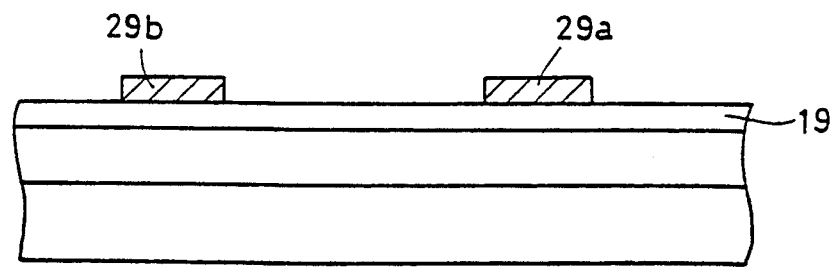

As illustrated in FIG. 7B, first aluminum film 29 is selectively etched away using resist 49 as a mask to leave first aluminum films 29a, 29b on BPSG film 19.

Figure 7C:
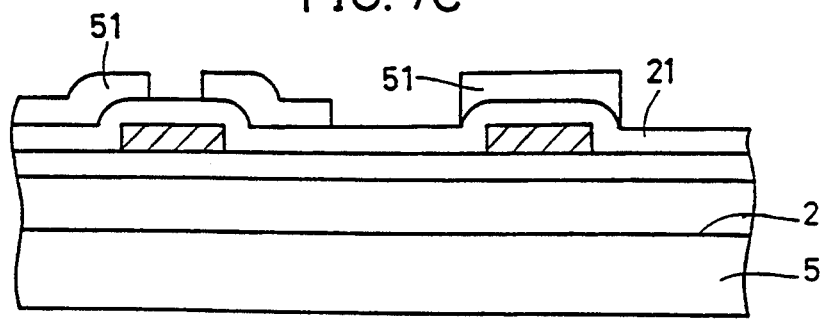

As illustrated in FIG. 7C, a plasma silicon oxide film 21 is formed over the whole of main surface 2 of silicon substrate 5 using a plasma CVD method. A resist 51 is formed over plasma silicon oxide film 21. Prescribed patterning is carried out on resist 51.

Figure 7D:
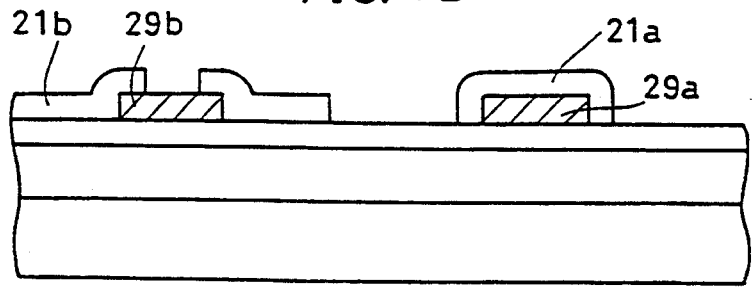

As illustrated in FIG. 7D, plasma silicon oxide film 21 is selectively etched away using resist 51 as a mask to leave plasma silicon oxide films 21a, 21b.

Figure 7E:
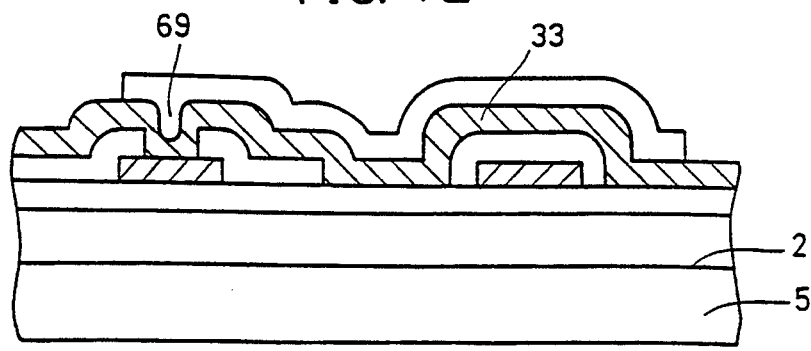

As illustrated in FIG. 7E, a second aluminum film 33 is formed over the whole of main surface 2 of silicon substrate 5 using the sputtering method. A resist 69 is formed over second aluminum film 33. Prescribed patterning is carried out on resist 69.

Figure 7F:
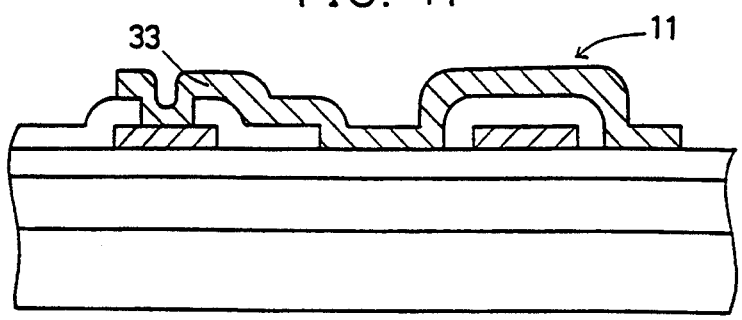

As illustrated in FIG. 7F, second aluminum film 33 is selectively etched away using resist 69 as a mask to form a bonding pad 11.

Figure 7G:
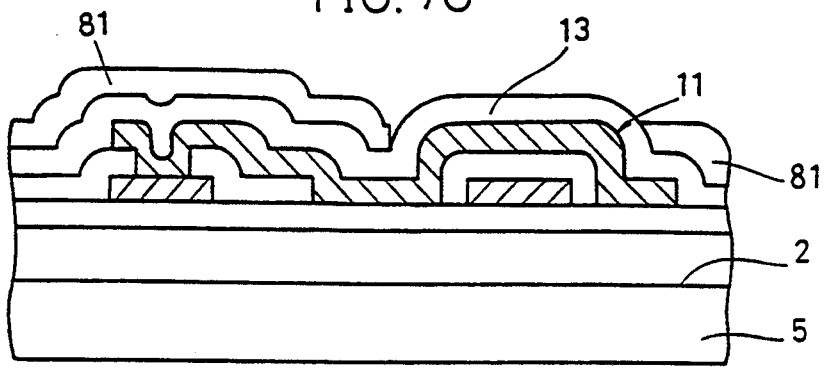
Figure 7H:
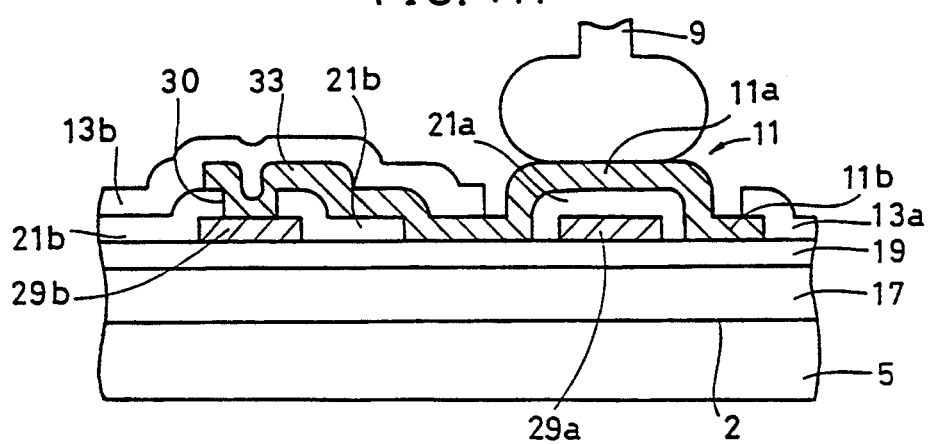

As illustrated in FIG. 7G, a plasma silicon nitride film 13 is formed over the whole of main surface 2 of silicon substrate 5 using a plasma CVD method. A resist 81 is formed over plasma silicon nitride film 13. Prescribed patterning is carried out on resist 81.

As illustrated in FIG. 7H, plasma silicon nitride film 13 is selectively etched away using resist 81 as a mask to expose bonding pad 11. Plasma silicon nitride films 13a, 13b are left on main surface 2. Bonding pad 11 and wire 9 are electrically connected. As described above, the formation process of the bonding pad comprised in the fifth embodiment of a semiconductor device according to the present invention is completed.

In the fifth embodiment of the present invention, plasma silicon oxide film 21a and first aluminum film 29a serve as central film raising means. As illustrated in FIG. 7C, if there is a step of etching away plasma silicon oxide film 21, plasma silicon oxide film 21 can be central film raising means.

(a sixth embodiment)

A bonding pad comprised in a sixth embodiment of a semiconductor device according to the present invention will be described in the following. FIG. 8H is a sectional view of a bonding pad comprised in a sixth embodiment of a semiconductor device according to the present invention. The structure is the same as the structure in FIG. 7H except that there is no plasma silicon oxide film 21a between a bonding pad 11 and a first aluminum film 29a, so that description of the structure will be omitted.

A method of forming the bonding pad comprised in the sixth embodiment of a semiconductor device according to the present invention will be described with reference to FIGS. 8A–8H. FIGS. 8A–8H are sectional views of a semiconductor device illustrating sequentially a formation process of the bonding pad comprised in the sixth embodiment of a semiconductor device according to the present invention.

Figure 8A:
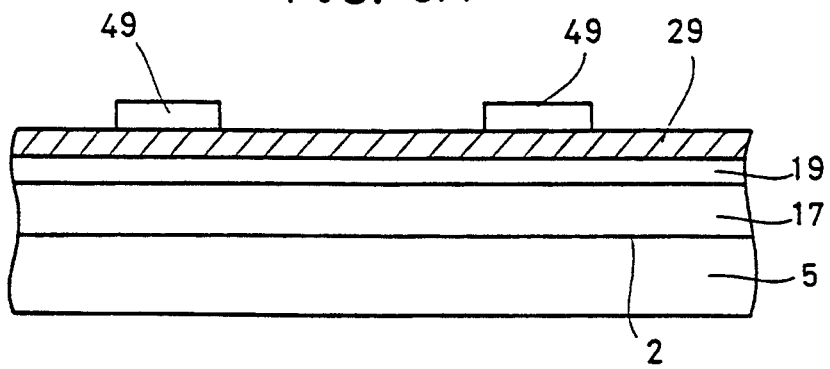
FIGS. 8A-8H are sectional views of a semiconductor device illustrating sequentially a formation process of a bonding pad comprised in a sixth embodiment of a semiconductor device according to the present invention.
Figure 8B:
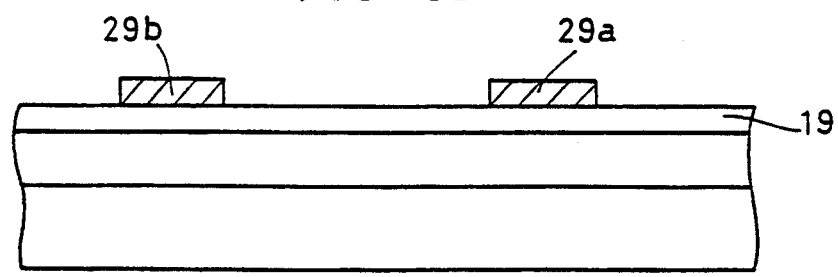
Figure 8C:
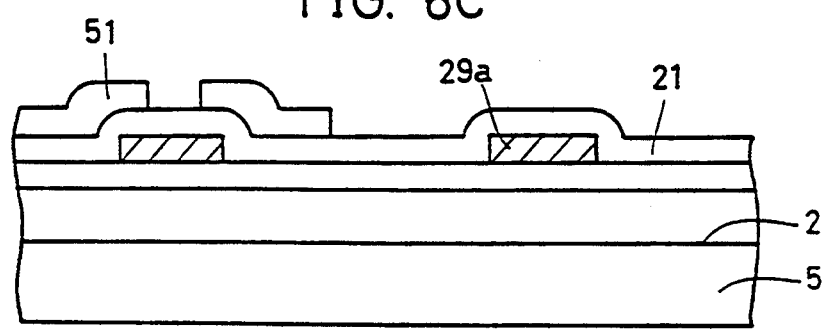

The process up to the step illustrated in FIG. 8B is the same as the process up to the step illustrated in FIG. 7B, so that description of it will be omitted. As illustrated in FIG. 8C, a plasma silicon oxide film 21 is formed on the whole of a main surface 2 of a silicon substrate 5 using a plasma CVD method. A resist 51 is formed on plasma silicon oxide film 21. Prescribed patterning is carried out on resist 51. The difference between FIG. 8C and FIG. 7C is that there is no resist 51 on first aluminum film 29a.

Figure 8D:
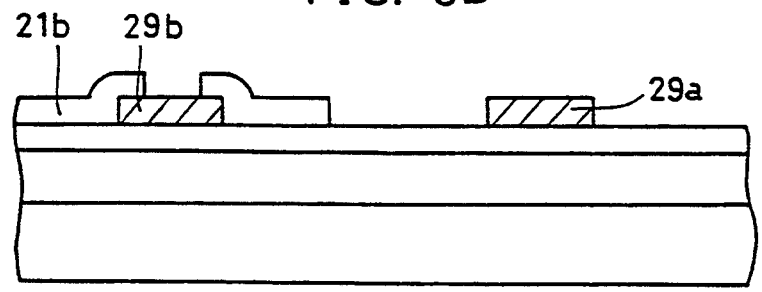

As illustrated in FIG. 8D, plasma silicon oxide film 21 is selectively etched away using resist 51 as a mask to leave a plasma silicon oxide film 21b.

Figure 8E:
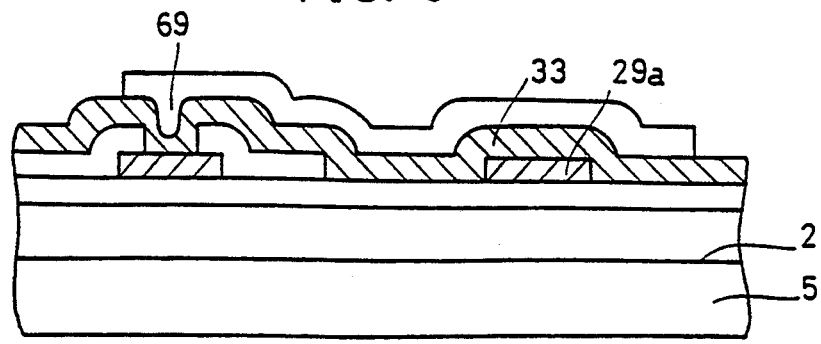

As illustrated in FIG. 8E, a second aluminum film 33 is formed on the whole of main surface 2 of silicon substrate 5 using a sputtering method. There is no plasma silicon oxide film on first aluminum film 29a, so that first aluminum film 29a is in contact with second aluminum film 33. A resist 69 is formed on second aluminum film 33. Prescribed patterning is carried out on resist 69.

Figure 8F:
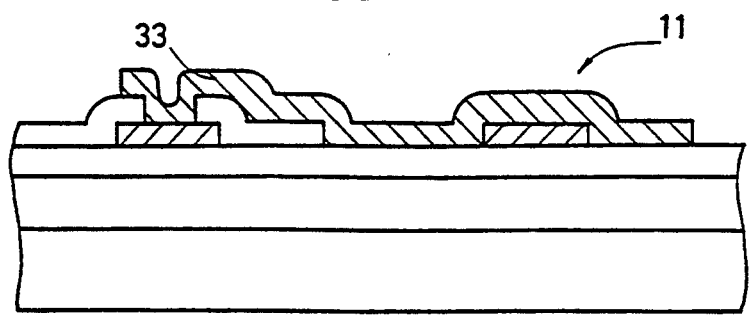

As illustrated in FIG. 8F, second aluminum film 33 is selectively etched away using resist 69 as a mask to form a bonding pad 11.

Figure 8G:
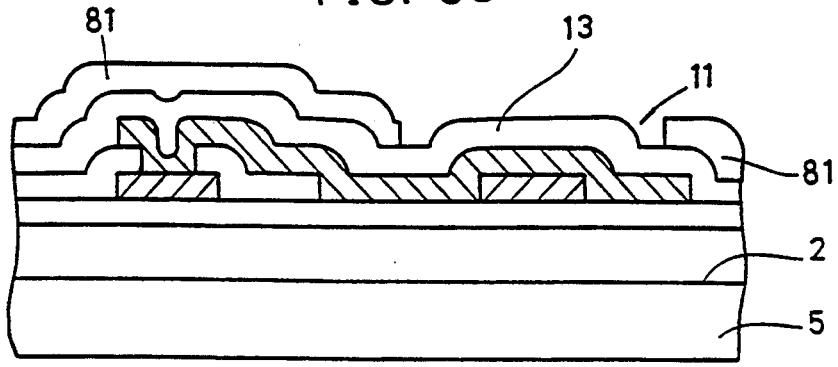
Figure 8H:
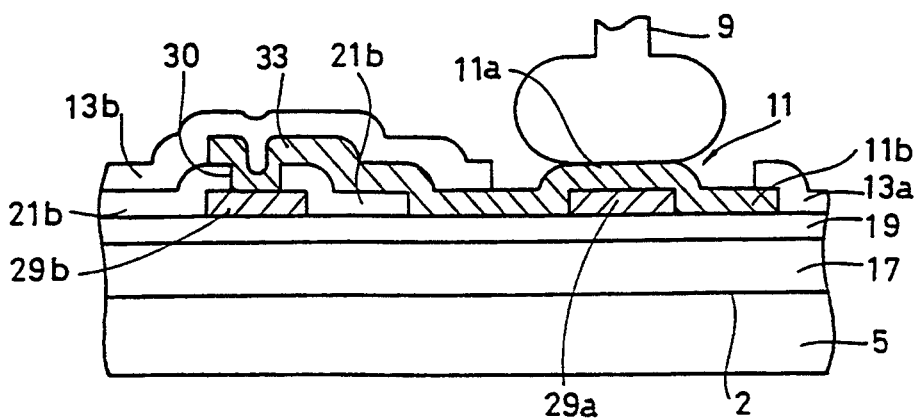
Figure 9:
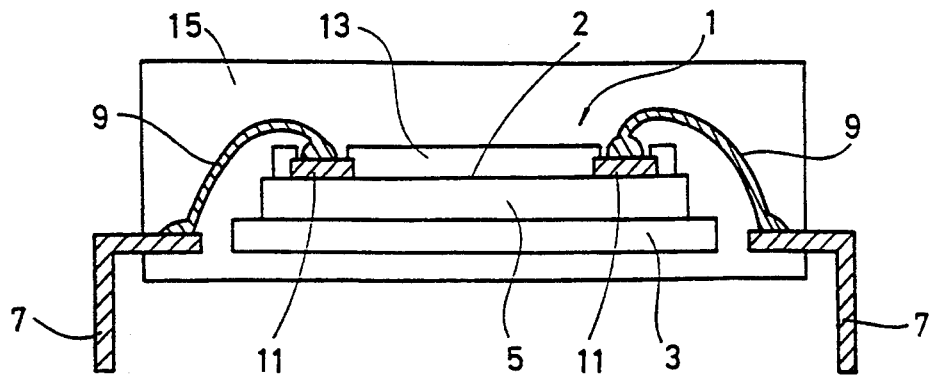
FIG. 9 is a sectional view of a conventional semiconductor device.
Figure 10:
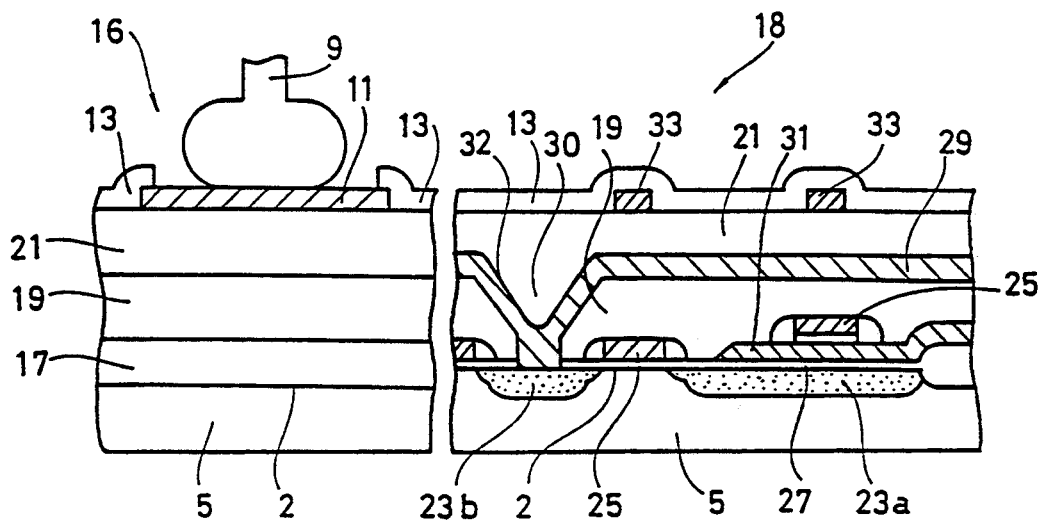
FIG. 10 is a sectional view of a bonding pad forming part and a DRAM forming part of the semiconductor device illustrated in FIG. 9.
Figure 11:
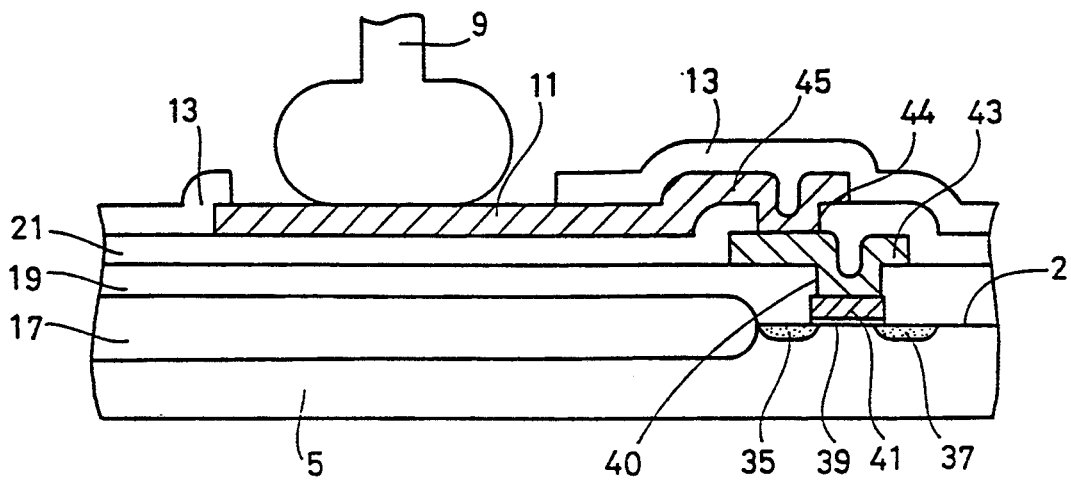
FIG. 11 is a sectional view of a semiconductor device illustrating an electrical connection state of a bonding pad and a MOS field effect transistor.
Figure 12A:
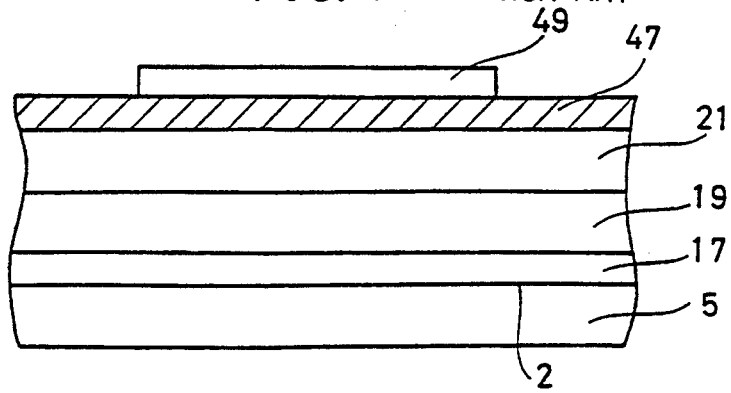
FIGS. 12A-12D are sectional views of a semiconductor device illustrating sequentially a formation process of a conventional bonding pad.
Figure 12B:
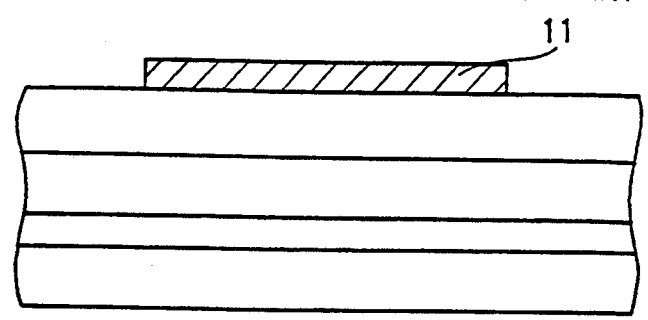
Figure 12C:
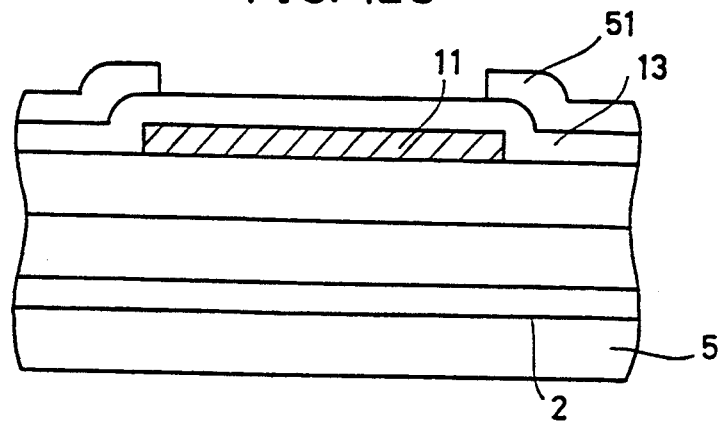
Figure 12D:
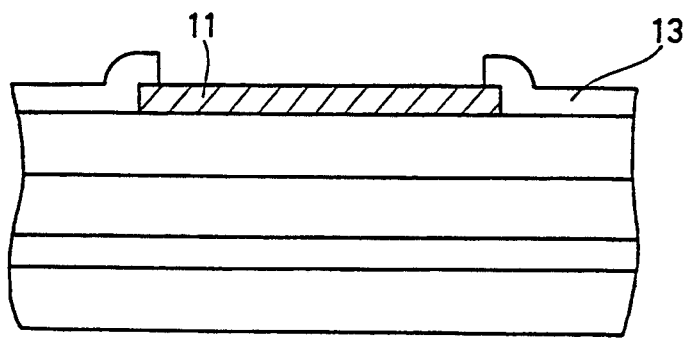
Figure 13A:
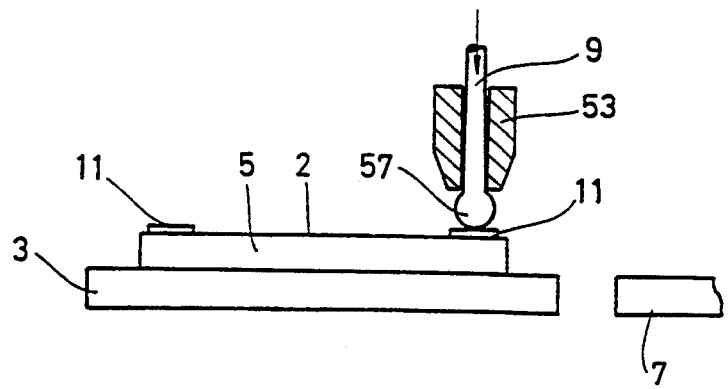
FIGS. 13A-13D are sectional views of a semiconductor device illustrating sequentially a process of wire bonding.
Figure 13B:
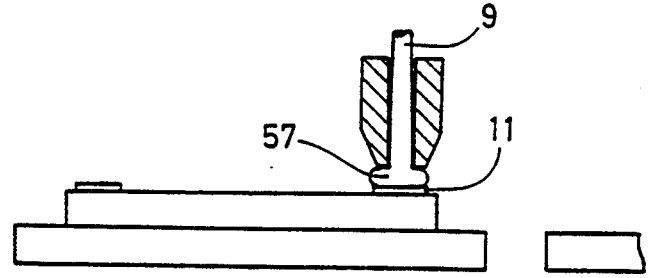
Figure 13C:
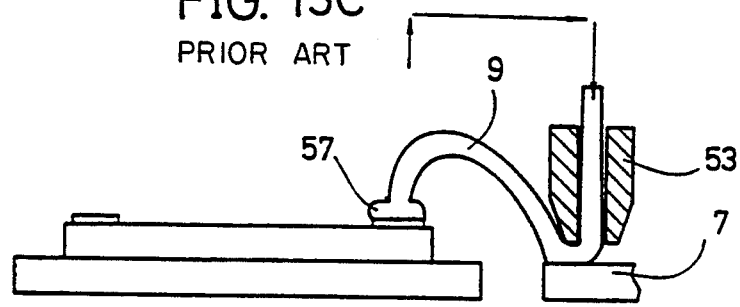
Figure 13D:
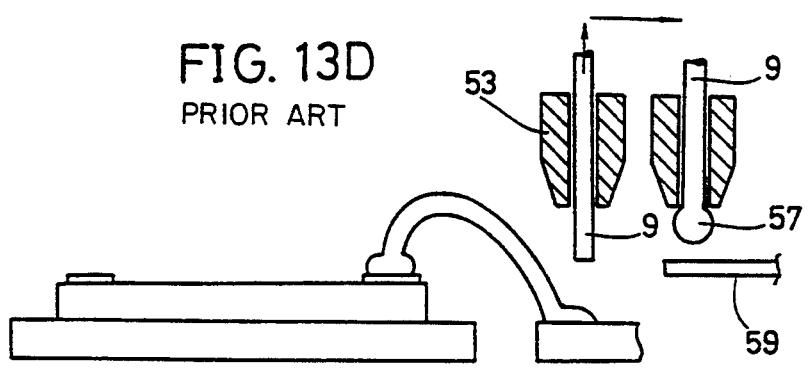
Figure 14:
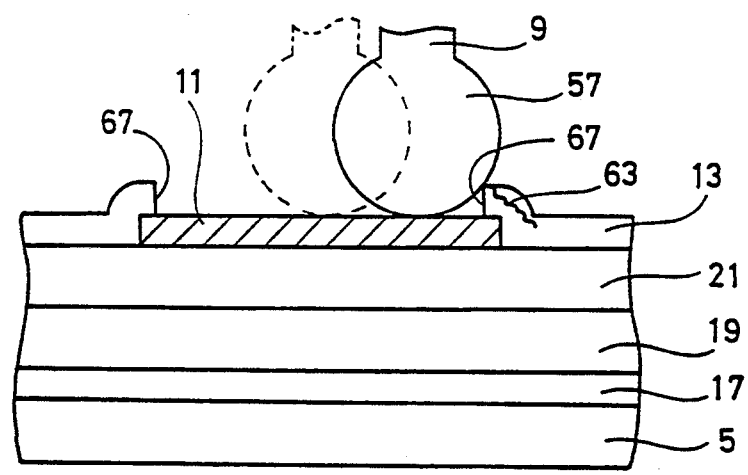
FIG. 14 is a sectional view of a semiconductor device for describing that a crack is generated during wire bonding.
Figure 15:
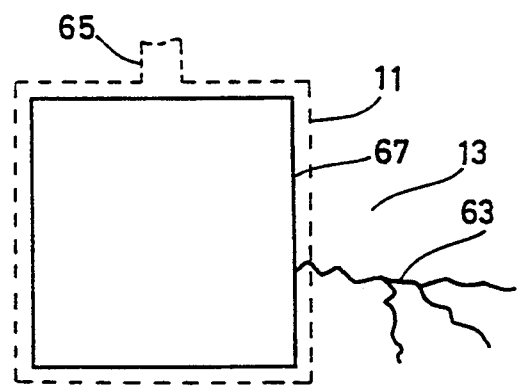
FIG. 15 is a plan view of the semiconductor device illustrated in FIG. 14 in which illustration of wire 9 is omitted.

As illustrated in FIG. 8G, a plasma silicon nitride film 13 is formed on the whole of main surface 2 of silicon substrate 5 using a plasma CVD method. A resist 81 is formed on plasma silicon nitride film 13. Prescribed patterning is carried out on resist 81.

As illustrated in FIG. 8H, plasma silicon nitride film 13 is selectively etched away using resist 81 as a mask to expose bonding pad 11. Plasma silicon nitride films 13a, 13b are left on main surface 2. Bonding pad 11 and a wire 9 are electrically connected. As described above, the formation process of the bonding pad comprised in the sixth embodiment of a semiconductor device according to the present invention is completed.

Referring to FIG. 2C, if step 11c in plasma silicon oxide film 21 as an interlayer insulating film is large, there is a possibility that second aluminum film 33 formed thereon is disconnected. Therefore, the viscosity of plasma silicon oxide film 21 is made low. Accordingly, in practice the difference in the levels in 11c of plasma silicon oxide film 21 is smaller than the thickness of first aluminum film 29.

By contrast, in the sixth embodiment of the present invention illustrated in FIG. 8H, bonding pad 11 is formed directly on first aluminum film 29a. Therefore, it is possible to make the difference between the levels of central film 11a and peripheral film 11b the same value as the thickness of first aluminum film 29a.

In the first to the sixth embodiments, at least more than one type of film selected from a group consisting of aluminum film, silicon oxide film, and field oxide film is used as central film raising means. In the present invention, however, it is not limited to this and may be any thin film formed on a substrate in a manufacturing process of a semiconductor device. For example, it may be polysilicon film, silicon nitride film and so on.

According to a bonding pad comprised in a semiconductor device in accordance with the present invention, the following effects are produced. For one thing, the area of the bonding pad can be reduced. For another thing, the bonding bad can be prevented from peeling off. For still another thing, during wire bonding, even if the tip of a wire moves in a lateral direction, no crack is generated in a surface protecting film.

According to a method of manufacturing a semiconductor device in accordance with the present invention, it is possible to form a bonding pad comprised in a semiconductor device in accordance with the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a substrate and an active element formed at a surface of said substrate, said semiconductor device comprising:

a bonding pad including a central film and a peripheral film around said central film, said peripheral film including a film being formed at the same time as said central film and continuous with said central film, said bonding pad being formed over the surface of said substrate, and being electrically connected to said active element;

central film raising means for raising said central film and making a level of said central film higher than a level of said peripheral film by being placed below said central film, said central film raising means including a first layer formed over the surface of said substrate and a second layer covering said first layer, said first and second layers being separated from each other and formed of the same material; and a protective film covering said bonding pad so as to expose said central film and to cover said active element for protecting said device from environmental influences, at least part of the protective film covering said peripheral film;

wherein the level of said central film is not lower than the level of said protective film covering said peripheral film, and said first and second layers for raising the central film are formed of the same material as the bonding pad.

2. A semiconductor device comprising a substrate and an active element formed at a surface of said substrate, said semiconductor device comprising:

a bonding pad including a central film and a peripheral film around said central film, said peripheral film including a film being formed at the same time as said central film and continuous with said central film, said bonding pad being formed over the surface of said substrate, and being electrically connected to said active element;

central film raising means for raising said central film and making a level of said central film higher than a level of said peripheral film by being placed below said central film, said central film raising means including a first layer formed over the surface of said substrate and a second layer covering said first layer, said first and second layers being separated from each other and formed of the same material; and a protective film covering said bonding pad so as to expose said central film and to cover said active element for protecting said device from environmental influences, at least part of the protective film covering said peripheral film;

wherein the level of said central film is not lower than the level of said protective film covering said peripheral film, and said first and second layers for raising the central film are formed of metal.

* * * * *